(12) United States Patent
Yu et al.

(10) Patent No.: US 6,338,759 B1
(45) Date of Patent: *Jan. 15, 2002

(54) METAL ORGANIC CHEMICAL VAPOR DEPOSITION APPARATUS AND DEPOSITION METHOD

(75) Inventors: Yong Sik Yu; Yong Ku Baek; Young Jin Park; Jong Choul Kim, all of Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/428,645

(22) Filed: Oct. 28, 1999

Related U.S. Application Data

(62) Division of application No. 08/921,560, filed on Sep. 2, 1997, now Pat. No. 6,008,143.

(30) Foreign Application Priority Data

Oct. 2, 1996 (KR) ............................................. 96-43625

(51) Int. Cl.$^7$ .............................................. C23C 16/00
(52) U.S. Cl. ........................ 118/726; 118/715; 118/50
(58) Field of Search ................................. 118/715, 726, 118/689, 690, 708, 50; 438/778

(56) References Cited

U.S. PATENT DOCUMENTS

| | | | | |
|---|---|---|---|---|
| 5,614,247 A | * | 3/1997 | Barbee et al. ................. | 427/8 |
| 5,620,524 A | * | 4/1997 | Fan et al. .................... | 118/726 |
| 5,711,816 A | * | 1/1998 | Kirlin et al. ................ | 118/726 |
| 5,820,678 A | * | 10/1998 | Hubert et al. ............... | 118/690 |
| 6,008,143 A | * | 12/1999 | Yu et al. ..................... | 438/778 |
| 6,074,487 A | * | 6/2000 | Yoshioka et al. ........... | 118/726 |
| 6,216,708 B1 | * | 4/2001 | Agarwal ..................... | 134/1.1 |
| 6,268,171 B1 | * | 7/2001 | Agarwal ..................... | 118/715 |

* cited by examiner

Primary Examiner—Jeffrie R. Lund
(74) Attorney, Agent, or Firm—Nath & Associates PLLC; Gary M. Nath; Jerald L. Meyer

(57) ABSTRACT

A metal organic chemical vapor deposition apparatus comprising a source ampule, a liquid micro-pump, a vaporizer equipped with a solvent supply means, and a reactor. A reactant dissolved in a solvent in the source ampule is transferred to the vaporizer by the liquid micro-pump. A sufficient amount of the solvent is additionally fed to the vaporizer by the solvent supply means, concurrently with the transfer, and vaporized along with the reactants. After being vaporized in the vaporizer, the reactant is injected to the reactor by carrier gas and deposited on a semiconductor substrate to form a high dielectric thin film. By virtue of the additional supplied solvent, the recondensation of the reactant in the vaporizer, which is attributed to the separation of the solvent from the reactant, can be prevented in the vaporizer and in the transfer line between the vaporizer and the reactor. In addition, the residues of the reactant, which may result from the separation, can be washed off by providing the solvent through the supply means to the vaporizer.

4 Claims, 3 Drawing Sheets

METAL ORGANIC CHEMICAL VAPOR DEPOSITION APPARATUS AND DEPOSITION METHOD

This application is a division of U.S. application Ser. No. 08/921,560, filed Sep. 2, 1997, now U.S. Pat. No. 6,008,143, issued Dec. 28, 1999.

BACKGROUND OF THE INVENTION

1. Field of the Invention

The present invention relates to a metal organic chemical vapor deposition (hereinafter referred to as "MOCVD") apparatus and to a deposition method. More particularly, the present invention relates to an MOCVD apparatus useful to deposit high dielectric thin film on a semiconductor substrate and to a deposition method using the same.

2. Description of the Prior Art

For the next generation DRAMs which are at least 1 Giga in memory size, conventional thin films not supply enough capacitance. As semiconductor devices scale down, three-dimensional capacitor structures, such as fin and cylinder type structures, are more difficult to construct because the scaling-down is accomplished at the sacrifice of cell area reduction.

In addition, reduction in the thickness of the thin film gives rise to an increase in leakage current at a source/drain region, an impurity region of a semiconductor device, and causes a soft error, a phenomenon wherein the information stored in a capacitor is changed or lost by $\alpha$-particles. So, a reliable capacitor is difficult to obtain. Further, if a capacitor is formed into a complex three-dimensional structure, subsequent processes are hard to perform.

Recently, active research has been directed to a high dielectric thin film deposition apparatus in order to apply high dielectric materials, such as BST ($BaSrTiO_3$) and $SrTiO_3$, for the thin film of a capacitor.

To construct high dielectric thin films, many methods are used, including a sputtering method, a sol-gel method, a laser ablation method, an MOCVD method, etc. Of them the MOCVD method guarantees a uniform thin film as well as allows the composition of the thin film to be easily controlled. Accordingly, the high dielectric thin film deposition apparatuses which utilize the MOCVD method are now being actively researched.

In order to better understand the background of the invention, a description will be given of a conventional MOCVD apparatus and its operation procedure, in conjugation with FIG. 1.

As shown in FIG. 1, a typical MOCVD apparatus comprises a reactant source ampule 10, a liquid micro pump 20 for delivering the reactants, a vaporizer 30, a reactor 70, a trap 60 and a vacuum pump. The reactants contained in the source ampule 10 are dissolved in a solvent. The liquid micro-pump 20 is used to transfer the resulting liquid to the vaporizer 30 in which the liquid is heated or vaporized with the aid of another energy source. Using a carrier gas, such as argon or nitrogen, the vapor is transferred the rector 70 and the vapor is deposited on a semiconductor substrate loaded in the reactor 70, to form a thin film. Here, pressure rising gas which is needed for the transfer of the reactants, is also argon or nitrogen.

During the transfer of the reactants dissolved in the solvent to the reactor, however, since the vaporization temperature of the solvent is much lower than that of the reactants, the solvent, although no heat is applied to the vaporizer, is separated faster than the reactants, recondensing the reactants. Accordingly, the recondensed reactants block the thin film transfer line between the vaporizer and the reactor and thus, are not constantly fed to the reactor. As a consequence, a deposited thin film is formed poor in properties.

Even when heat is applied to the vaporizer in order to constantly maintain the vapor pressure of the reactants necessary for the thin film deposition, the solvent is faster vaporized than the reactants, resulting in the decomposition of the reactants. Likely, the reactants cannot be constantly fed to the reactor since the decomposed reactants block the thin film transfer line between the vaporizer and the reactor. So, it is difficult to form a thin film reliable and excellent in electrical properties.

SUMMARY OF THE INVENTION

Therefore, it is an object of the present invention to overcome the above problems encountered in the prior arts and to provide an MOCVD apparatus in which the reactants are prevented from being recondensed and decomposed in the vaporizer.

It is another object of the present invention to provide a method for forming a high dielectric thin film by using the apparatus.

In accordance with an aspect of the present invention, there is provided an MOCVD apparatus for forming a high dielectric thin film, comprising a source ampule containing reactants in a solvent, a liquid micro-pump for delivering the dissolved reactants, a vaporizer for vaporizing the dissolved reactants delivered by the micro-pump and a reactor for depositing the vaporized reactants on a semiconductor substrate loaded therein, said vaporized reactant being fed to said reactor by a carrier gas, wherein said vaporizer is additionally provided with a solvent supply means for feeding an additional amount of the solvent to said vaporizer, in order to prevent the reactants from being recondensed in the vaporizer and the recondensed reactants, if may be present, from blocking a transfer line between the vaporizer and the reactor.

In accordance with another aspect of the present invention, there is provided an MOCVD method for forming a high dielectric thin film on a semiconductor substrate, comprising the steps of: feeding a reactant dissolved in a solvent to a vaporizer which is additionally provided with the solvent via a separate supply means; vaporizing the reactant in the vaporizer; and transferring the vaporized reactant to a reactor by carrier gas, in which the reactant is deposited on the semiconductor substrate.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

The application of the preferred embodiments of the present invention is best understood with reference to the accompanying drawings.

Figure 1:
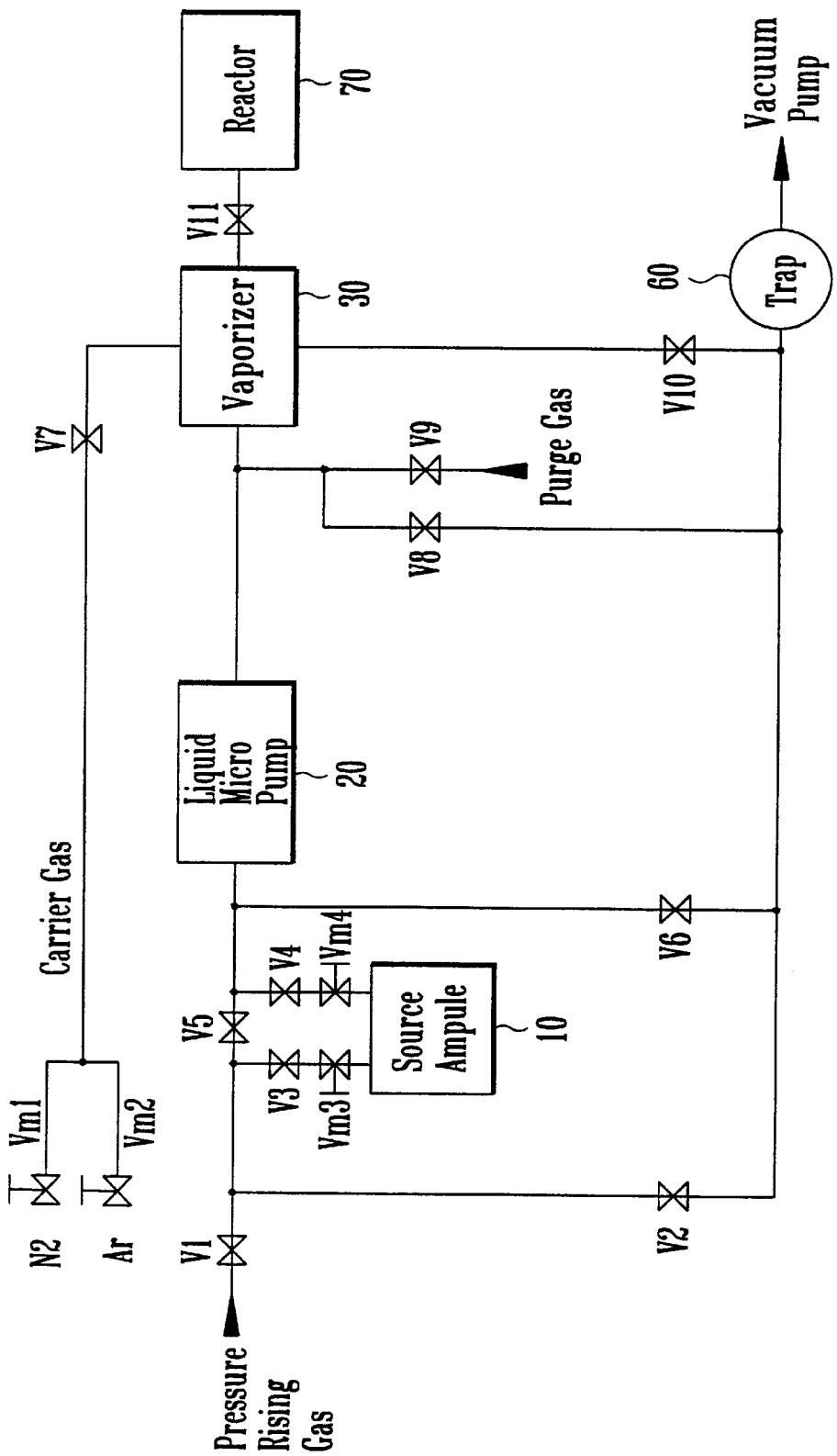
FIG. 1 is a schematic view illustrating a conventional MOCVD apparatus.
Figure 2:
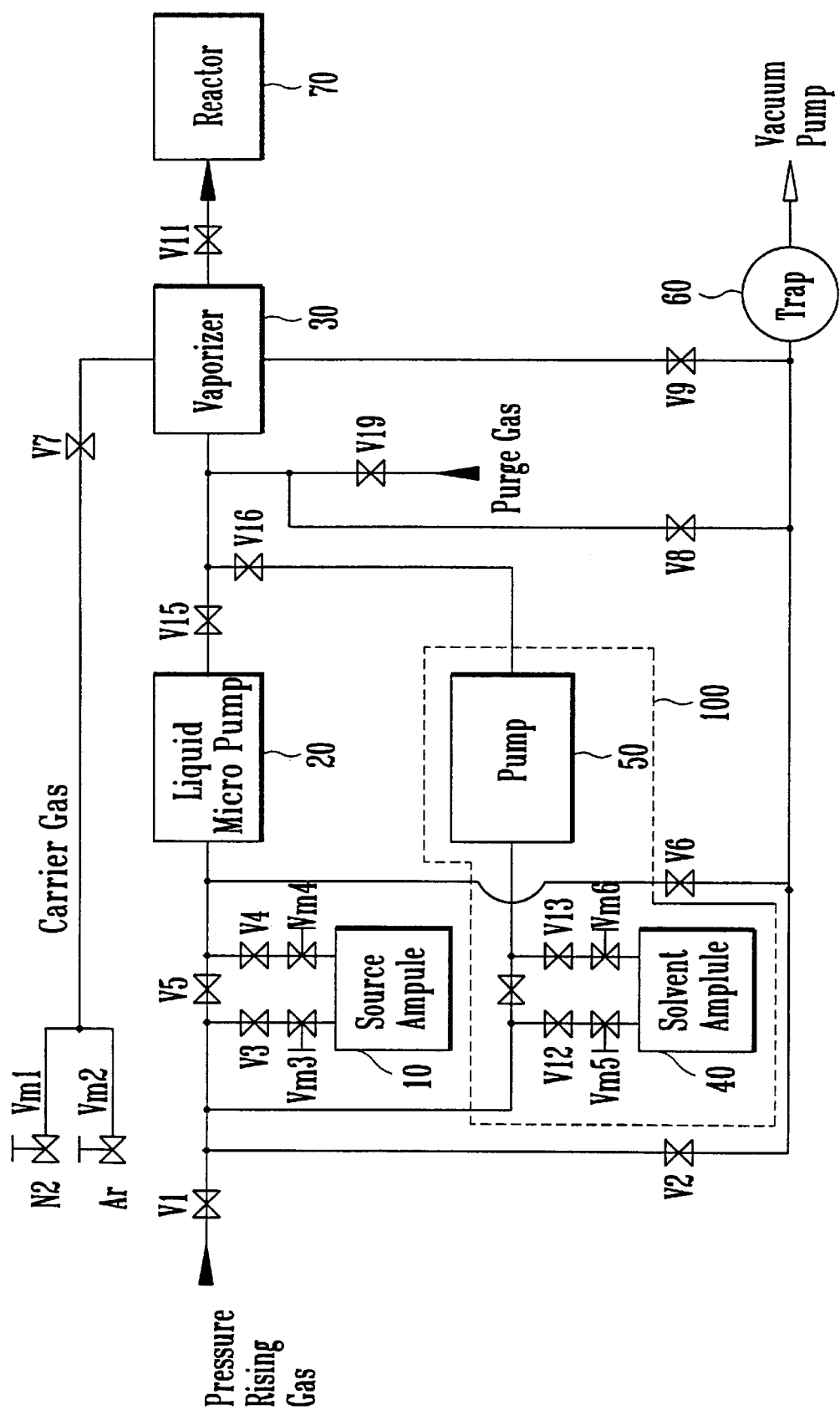
FIG. 2 is a schematic view illustrating an MOCVD apparatus according to the present invention.

Referring to FIG. 2, there is shown a concept for a MOCVD apparatus according to the present invention. As seen, the MOCVD apparatus of the invention is identical to the conventional one in that it comprises a source ampule 10 containing reactants in a solvent, a liquid micro-pump 20, a vaporizer 30 for vaporizing the liquid reactants, a reactor 70 for depositing the reactants on a semiconductor substrate, a trap 60 for blocking injurious gas by cooling and a vacuum pump, different in that the vaporizer 30 is further equipped with a solvent supply means 100 comprising a solvent ampule 40 and a pump 50.

A description will be given of the procedure for forming a high dielectric thin film, in connection with this figure.

As the reactants, $Ba(DPM)_2$, $Sr(DPM)_2$ and $Ti(DPM)_2$ (DPM stands for di-pivaloyl methanate), or materials containing Sr, Ti and $O_3$ are used. These reactants are dissolved in a solvent in the source ampule 10 and transferred to the vaporizer 30 by the liquid micro-pump 20. Isopropyl amine is sufficiently fed to the vaporizer 30 by the solvent supply means 100, concurrently with the transfer, and vaporized along with the reactants. Isopropyl amine has an aim of preventing the recondensation of the reactants in the vaporizer 30 and in the transfer line between the vaporizer 30 and the reactor 70. Thereafter, using carrier gas, such as argon or nitrogen, the vaporized reactants are fed through the transfer line to the reactor 70 and then, deposited on a semiconductor substrate loaded in the reactor to form a high dielectric thin film (for example, BST or $SrTiO_3$ film)

As aforementioned, the recondensation of the reactants within the vaporizer 30 is attributed to the fact that the solvent is faster vaporized than the reactants although no heat is applied to the vaporizer because the solvent is lower than the reactants in vaporization temperature.

Alternatively, each of the reactants, for example, $Ba(DPM)_2$, $Sr(DPM)_2$ and $Ti(DPM)_2$, may be transferred to the vaporizer via individual source ampules and liquid micro pumps.

According to another embodiment of the present invention, after the deposition of the high dielectric thin film, sufficient solvent is re-fed to the vaporizer 30 via the solvent supply means 100 to remove recondensed reactant residues within the vaporizer, in order to prevent recondensed reactant residues from blocking the transfer line between the vaporizer 30 and the reactor 70. Still remaining reactant residues may be removed by purge gas, such as argon and nitrogen.

Figure 3:
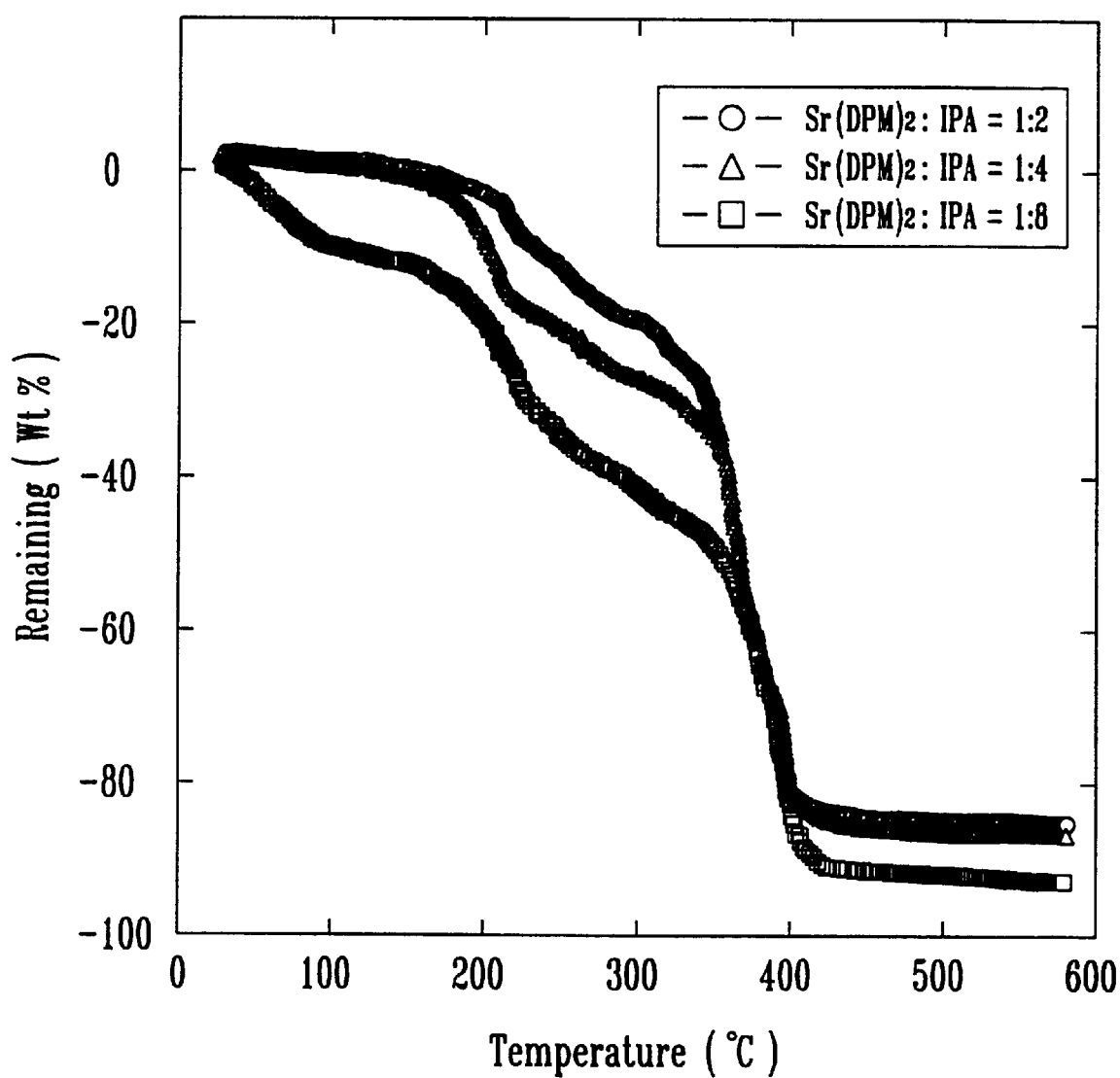
FIG. 3 is a graph in which the amounts of the residues according to solvent amounts are plotted with respect to the temperature of the vaporizer.

Referring to FIG. 3, there are plotted the amounts of the residues according to solvent amounts with respect to the temperature of the vaporizer. As seen, the residue proportion (wt %) is different depending on the ratio of $Sr(DPM)_2$, the reactant to isopropyl amine, the solvent, at a temperature range of 100–600° C. The more the solvent, the less the reactant residue. It was found that, when the ratio of the reactant to the solvent ranges from 1:10 to 1:20, the residues were little present.

Even when the ratio of the solvent to the reactant is high, the ratio is lowered while the liquid mix is transferred from the source ampule to the vaporizer. However, the additional feeding of the solvent to the vaporizer as in the present invention can maintain a sufficient amount of solvent. Such little residues as in the present invention reflect the reduction of the recondensed reactant in amount, meaning that the blockage of the transfer line occurs less frequently.

As described hereinbefore, a sufficient amount of solvent can be additionally fed to the vaporizer when a high dielectric thin film is formed by use of the MOCVD apparatus of the present invention. Therefore, the recondensation of the reactant attributable to the decomposition of solvent within the vaporizer can be minimized, thereby solving the problem of blocking the transfer line.

In addition, after the deposition of a thin film on a semiconductor substrate, it is possible to completely remove the reactant residues remaining within the vaporizer by dissolving the residues in the solvent by virtue of the additional solvent supply means provided to the vaporizer. Therefore, the aggravation of the thin film in physical properties owing to the contamination of the vaporizer can be prevented, and the reproductivity of thin film can be obtained as the reactants are stably fed to the reactor.

It is further understood by those skilled in the art that the foregoing description is that of preferred embodiments of the disclosed MOCVD apparatus and that various changes and modifications may be made in the invention without departing from the spirit and scope thereof.

What is claimed is:

1. A metal organic chemical deposition apparatus for forming a high dielectric thin film, comprising a source ampule containing reactants in a solvent, a liquid micro-pump for delivering the dissolved reactants, a vaporizer for vaporizing the dissolved reactants delivered by the micro-pump and a reactor for depositing the vaporized reactants on a semiconductor substrate loaded therein, said vaporized reactant being fed to said reactor by a carrier gas, wherein said vaporizer is additionally provided with a solvent supply means for feeding an additional amount of the solvent to said vaporizer, in order to prevent the reactants from being recondensed in the vaporizer and the recondensed reactants from blocking a transfer line between the vaporizer and the reactor.

2. A metal organic chemical deposition apparatus in accordance with claim 1, wherein said reactants comprise $Ba(di\text{-}pivaloyl\ methanate)_2$, $Sr(di\text{-}pivaloyl\ methanate)_2$ and $Ti(di\text{-}pivaloyl\ methanate)_2$.

3. A metal organic chemical deposition apparatus in accordance with claim 1, wherein said additional solvent is isopropyl amine.

4. A metal organic chemical deposition apparatus in accordance with claim 1, wherein said solvent supply means comprises a solvent ampule and a pump.

* * * * *